United States Patent
Tsukamoto

(10) Patent No.: US 7,928,880 B2
(45) Date of Patent: Apr. 19, 2011

(54) DIGITAL ANALOG CONVERTER

(75) Inventor: Sanroku Tsukamoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 17 days.

(21) Appl. No.: 12/539,940

(22) Filed: Aug. 12, 2009

(65) Prior Publication Data

US 2010/0039303 A1  Feb. 18, 2010

(30) Foreign Application Priority Data

Aug. 18, 2008  (JP) ................................ 2008-209867

(51) Int. Cl.
  *H03M 1/66*  (2006.01)
(52) U.S. Cl. ........................................ 341/144; 341/153
(58) Field of Classification Search .................. 341/144, 341/145, 155, 172, 150, 153
See application file for complete search history.

(56) References Cited

U.S. PATENT DOCUMENTS

| | | | | |
|---|---|---|---|---|
| 5,235,335 A * | 8/1993 | Hester et al. | ................... | 341/172 |
| 5,434,569 A * | 7/1995 | Yung et al. | ..................... | 341/172 |
| 6,496,131 B2 * | 12/2002 | Yoshinaga | ...................... | 341/150 |
| 6,686,865 B2 * | 2/2004 | Confalonieri et al. | ......... | 341/172 |
| 6,707,403 B1 * | 3/2004 | Hurrell | ........................... | 341/120 |
| 7,786,917 B2 * | 8/2010 | Hu et al. | ....................... | 341/150 |
| 2001/0002819 A1 | 6/2001 | Ikeda | | |

FOREIGN PATENT DOCUMENTS

| | | |
|---|---|---|
| JP | 57-124933 A | 8/1982 |
| JP | 62-245723 A | 10/1987 |
| JP | 2-155457 A | 6/1990 |
| JP | 2001-160757 A | 6/2001 |
| JP | 2002-190732 A | 7/2002 |
| JP | 2002-190738 A | 7/2002 |

OTHER PUBLICATIONS

Hae-Sung, Lee "A self calibrating 12b 12 μs CMOS ADC", IEEE International Solid-State Circuits Conference, vol. XXVII, Feb. 1984, 64-65.
Jens, Sauerbrey "A 0.5V, 1 μW successive approximation ADC", Proceedings of the 28th European Solid-State Circuits Conference, Sep. 2002.
Kul, Ohri "Integrated PCM codec", IEEE Journal of Solid-State Circuits, vol. 14 Feb. 1979. Jan. 1, 1979, 38-46.

* cited by examiner

*Primary Examiner* — Peguy JeanPierre
(74) *Attorney, Agent, or Firm* — Fujitsu Patent Center

(57) ABSTRACT

A digital analog converter has an input terminal receiving a digital input signal, a lower-side capacitor group coupled to a lower-side common terminal in parallel, an upper-side capacitor group coupled, in parallel, to an upper-side common terminal at which an analog output signal is generated, a coupling capacitor provided between the lower-side common terminal and the upper-side common terminal, a switch group coupled to the upper-side capacitor group and the lower-side capacitor group and controlled as a conduction state and a non-conduction state in accordance with the digital input signal, and an adjusting capacitor coupled to the lower-side common terminal and having a variable capacitance value.

9 Claims, 18 Drawing Sheets

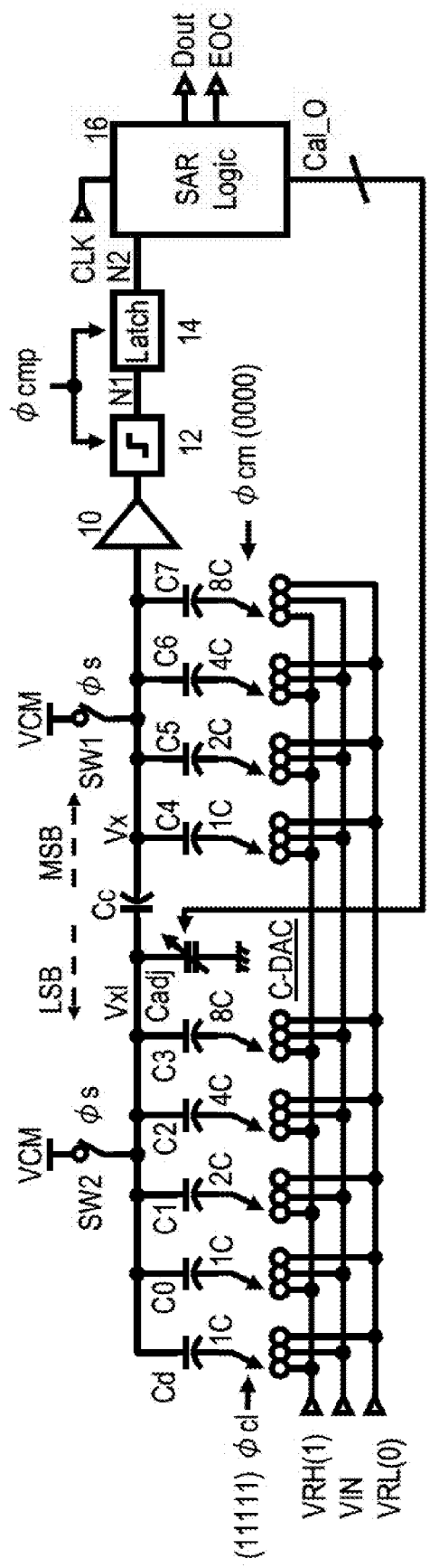
FIG. 7A
FIG. 7B
FIG. 7C

DIGITAL ANALOG CONVERTER

CROSS-REFERENCE TO RELATED APPLICATIONS

This application is based upon and claims the benefit of priority from the prior Japanese Patent Application No. 2008-209867, filed on Aug. 18, 2008, the entire contents of which are incorporated herein by reference.

FIELD

The present invention relates to a digital analog converter (DAC).

BACKGROUND

A charge redistribution type DAC has a plurality of capacitors which are coupled to one another in parallel. The plurality of capacitors have capacitance values which are weighted by a binary rate (1:2:4:8: . . . :2L). In the following description, "DAC" means the charge redistribution type DAC. Under a reset state, the charge states of the plurality of capacitors in DAC are reset while the common coupling node of the plurality of capacitors is set to a reference potential. On the other hand, under an operation state, any one of a high reference voltage and a low reference voltage is applied to electrodes of the plurality of capacitors at the opposite side to the common coupling node, out of the electrodes of the plurality of capacitors, to generate an analog output voltage at the common coupling node.

The DAC is disclosed in patent documents, for example, Japanese Laid-open Patent Publications No. S-57-124933, No. S-62-245723, No. 2002-190732, No. 2001-160757 and No. H-2-155457 and in a non-patent document, for example, Kul B. Ohri, Michael J. Callahan Jr.; Integrated PCM codec, IEEE Journal of Solid-State Circuits, vol. 14, pp. 38-46, February 1979.

With respect to the DAC, the number of capacitors increases as the number of bits of a digital input signal increases. When the number of capacitors increases, the capacitance values of capacitors corresponding to upper-side bits (MSB-side bits) are larger. The increase of the capacitance values of the capacitors causes an increase of the chip area of an integrated circuit. Therefore, there has been proposed a DAC having a coupling capacitor provided between a capacitor group of capacitors corresponding to upper-side (MSB-side) bits and a capacitor group of capacitors corresponding to lower-side (LSB-side) bits. In the DAC having the coupling capacitor, the capacitance values of the capacitor groups at the upper side and at the lower side are respectively weighted by binary rates. The DAC having the coupling capacitor is disclosed in the above patent documents and the above non-patent document.

Furthermore, a successive approximation analog digital converter (ADC) having the DAC samples an analog input voltage and compares the sampled analog input voltage with a comparison target voltage generated by the DAC. This comparison operation is successively repeated from the most significant bit (MSB) of the digital input signal of the DAC to the least significant bit (LSB). In the successive approximation operation, a comparison target voltage in the approximation operation for a lower-side bit is varied in accordance with a comparison result of an upper-side bit which is just above the concerned lower-side bit.

The successive approximation ADC is disclosed in non-patent documents, for example, Jens Sauerbrey, Doris Schmitt-Landsiedel, Roland Thewes; A 0.5V, 1 µW successive approximation ADC, Proceedings of the 28th European Solid-State Circuits Conference, September 2002, and Hae-Sung Lee, David A. Hodges, Paul R. Gray; A self calibrating 12 b 12 µs CMOS ADC, IEEE International Solid-State Circuits Conference, vol. XXVII, pp. 64-65, February 1984. The successive approximation ADC has a DAC for generating a discrete comparison target voltage. The ADCs described in the non-patent documents have analog input terminals, a DAC, a comparator for comparing an analog input voltage and a comparison target voltage, and a Successive Approximation Register Logic Circuit (SAR logic circuit) for storing the results of the comparator to output a digital output signal. The digital input signal of the DAC is generated in accordance with the comparison result at each bit by the SAR logic circuit.

In the DAC having the coupling capacitor provided between the upper-side and lower-side capacitor groups, it is required to form the capacitance value of the coupling capacitor with high precision. The patent documents propose a circuit construction in which the capacitance value of the coupling capacitor is equal to the capacitance value of the capacitor of the least significant bit.

SUMMARY

According to an aspect of the invention, a digital analog converter has an input terminal receiving a digital input signal, a lower-side capacitor group coupled to a lower-side common terminal in parallel, an upper-side capacitor group coupled, in parallel, to an upper-side common terminal at which an analog output signal is generated, a coupling capacitor provided between the lower-side common terminal and the upper-side common terminal, a switch group coupled to the upper-side capacitor group and the lower-side capacitor group and controlled as a conduction state and a non-conduction state in accordance with the digital input signal, and an adjusting capacitor coupled to the lower-side common terminal and having a variable capacitance value.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF THE DRAWINGS

FIGS. 7A to 7C are diagrams illustrating a switch state of a period P1 of the ADC illustrated in FIG. 5;

DESCRIPTION OF EMBODIMENTS

Figure 1:
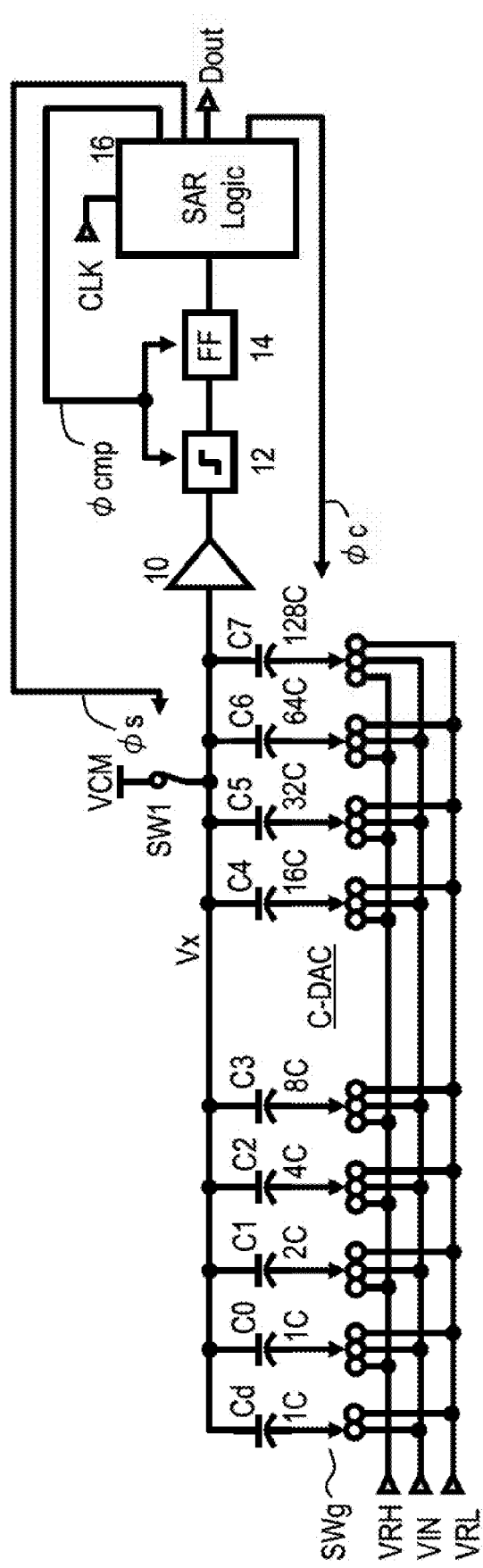
FIG. 1 illustrates a reset state of a successive approximation ADC.

A capacitor in a DAC formed of a semiconductor integrated circuit has parasitic capacitance, and thus it is difficult to generate an analog output voltage from a digital input signal with high precision. A weighting rate value of a capacitor group at a lower side and a capacitor group at an upper side is different from an ideal value due to the existence of parasitic capacitance, that is, the weighting rate value is smaller than the ideal value, so that the step voltage of the analog output voltage is non-uniform.

Accordingly, it is desired to form a DAC in which a high-precision analog output level may be generated even in the case of the existence of parasitic capacitance.

Furthermore, it is also desired to provide a successive approximation ADC having a DAC which generates a high-precision analog output level even in the case of the existence of parasitic capacitance.

A first DAC according to an embodiment of the present invention has a capacitor group at a lower side (i.e., a capacitor group containing capacitors corresponding to lower-side bits (LSB-side bits))(hereinafter referred to as "lower-side capacitor group") having capacitance values weighted by a binary rate, and a capacitor group at an upper side, i.e., a capacitor group containing capacitors corresponding to upper-side bits (MSB-side bits), (hereinafter referred to as "upper-side capacitor group") having capacitance values weighted by a binary rate. The capacitors of the lower-side capacitor group are coupled to a first common terminal in parallel. The capacitors of the upper-side capacitor group are coupled to a second common terminal in parallel.

A coupling capacitor is further provided between the first common terminal and the second common terminal. A switch group (made up of switches) whose conduction and non-conduction states are controlled in accordance with a digital input signal is further provided to terminals of the lower-side capacitor group at the opposite side to the first common terminal and terminals of the upper-side capacitor group at the opposite side to the second common terminal. Furthermore, an adjusting capacitor whose capacitance value is variably adjustable is provided at the common terminal at the lower-side capacitor group side.

Here, when upper-side bits (MSB-side bits) of the digital input signal are set to a first upper-side bit value, and lower-side bits (LSB-side bits) of the digital input signal are set to a first lower-side bit value at which the values of all the bits contained in the lower-side bits are equal to 0 or 1, the potential of the common terminal at the upper capacitor group side, i.e., the upper-side common terminal, is defined as a first potential. Furthermore, when the upper-side bits of the digital input signal are set to a second upper-side bit value which is different from the first upper-side bit value by only the minimum bit, and the lower-side bits of the digital input signal are set to a second lower-side bit value at which the values of all the bits contained in the lower-side bits are equal to 1 or 0, the potential of the common terminal at the upper capacitor group side, i.e., the upper-side common terminal, is defined as a second potential. In this case, it is preferable that the capacitance value of this adjusting capacitor is adjusted so that the first potential of the upper-side common terminal is substantially equal to the second potential at the upper-side common terminal.

The degradation of the precision due to the parasitic capacitance may be suppressed by adjusting the capacitance value of the adjusting capacitor in a calibration process.

A second DAC according to an embodiment has a lower-side capacitor group at a lower side including lower-side capacitors and an upper-side capacitor group at an upper side including upper-side capacitors each of which has a capacitor group having capacitance values weighted by a binary rate and is coupled to a common terminal in parallel, a coupling capacitor provided between the common terminals of the lower-side and upper-side capacitor groups, and a switch group which is provided at the terminals of the lower and upper-side capacitor groups at the opposite side to the common terminals concerned and whose conduction and non-conduction states are controlled in accordance with the digital input signal, and the capacitance value of the coupling capacitor is variably adjustable.

The capacitance value of the adjustable coupling capacitor is preferably adjusted so that the potential of the upper-side common terminal when the bits making up the digital input signal are set to the first upper-side bits and the first lower-side bits all of which are equal to 0 or 1 is equal to the potential of the upper-side common terminal when the bits making up the digital input signal are set to the second upper-side bits different from the first upper-side bits by the minimum bit and the second lower-side bits all of which are equal to 1 or 0.

A third DAC according to an embodiment has both an adjusting capacitor having a variably-controllable capacitance value and a coupling capacitor having a variably-controllable capacitance value according to the first and second DACs. Preferably, the capacitance values of both the adjusting capacitor and the coupling capacitor or the capacitance value of the adjusting capacitor or the coupling capacitor is adjusted as described above.

Furthermore, a successive approximation ADC according to an embodiment has the first, second, or third DAC, and also has a comparator for comparing a comparison target voltage generated in a DAC with an analog input voltage, and a logic circuit for generating a control signal to control a comparison target voltage of a DAC for next bit determination in accordance with a comparison result of the comparator.

The capacitance value of the adjusting capacitor or the coupling capacitor is adjusted to a proper value, and thus DA conversion precision is enhanced.

Embodiments according to the present invention will be described with reference to the drawings.

Figure 2:
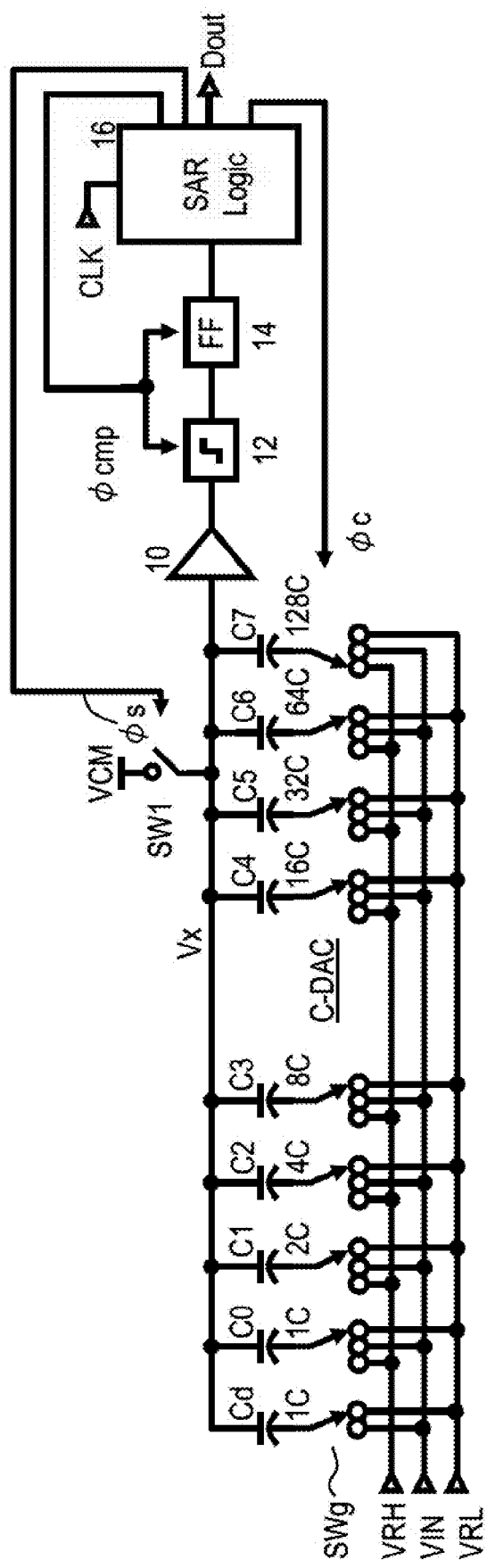
FIG. 2 illustrates an operation state of the successive approximation ADC.

FIGS. 1 and 2 are diagrams illustrating the construction of a successive approximation ADC. The successive approximation ADC is a circuit for converting an analog input voltage VIN to a digital output signal Dout. The successive approximation ADC includes a DAC having a capacitor group (capacitors) Cd, C0 to C3, and C4 to C7 having capacitance values weighted by a binary rate, a switch group (switches) SWg, a buffer amplifier 10 for amplifying the voltage of a common terminal Vx of the capacitor group, a comparator 12 for comparing the output of the buffer amplifier 10 with a reference potential VCM as a threshold voltage, for example, 0V, a flip-flop 14 for latching the output of the comparator 12, and an SAR logic circuit 16 for successively accumulating a latch signal of the flip-flop 14 and outputting a digital output signal Dout of plurality of bits. The successive approximation ADC has a DAC therein.

In the example of FIGS. 1 and 2, the digital output signal Dout includes 8 bits, and the ADC converts an analog input voltage VIN to a digital signal of 256 gradations. The capacitance values of the capacitors of the capacitor group are set to 1C, 1C, 2C, 4C, 8C, 16C, 32C, 64C, and 128C. In this case, C means a unit capacitance value. The capacitor Cd is a dummy capacitor, and it is required to convert the analog input voltage to the digital output signal with a resolution corresponding to one part of the equally-divided 256 parts. If the dummy capacitor Cd is not provided, the resolution would correspond to one part of the equally-divided 255 parts, and thus no dummy capacitor Cd is provided in some cases.

The SAR logic circuit 16 outputs control signals $\phi s$, $\phi cmp$, $\phi c$ in synchronism with a clock CLK. The control signal $\phi s$ controls a switch SW1 for coupling the common terminal Vx to the reference potential VCM. The control signal $\phi cmp$ is an operation timing signal for the comparator 12 and the flip-flop 14. The control signal $\phi c$ is a control signal for coupling the switch group SWg to any one of a high reference voltage VRH, a low reference voltage VRL, or an analog input voltage VIN.

The control signal $\phi c$ corresponds to the digital input signal of the DAC. An analog output voltage to which the digital input signal is converted is input to the common terminal Vx.

The operation of the successive approximation ADC will be briefly described below.

During a sampling period of FIG. 1, all the switches of the switch group SWg are set to the terminals of the analog input voltage VIN, and the switch SW1 is set to a coupling state to couple the reference potential VCM to the common terminal Vx. Accordingly, the following charge Q0 is accumulated in the capacitor group:

$$Q0=256C(VIN-VCM) \quad (1)$$

The analog input voltage VIN is sampled to the capacitor group of a DA converter C-DAC.

Subsequently, during a successive approximation operation period, as illustrated in FIG. 2, the switch SW1 is controlled to be set to OFF by the control signal $\phi s$. At the initial stage of the successive approximation operation, with respect to the switch group SWg, the switch for the highest-side capacitor C7 (i.e., the capacitor of the MSB) is coupled to the high reference voltage VRH side, and the switches for the other capacitors Cd, C0 to C6 are coupled to the low reference voltage VRL side by the control signal $\phi c$. Accordingly, the charge Q1 of the capacitor group is represented as follows:

$$Q1=128C(VRH-Vx)+128C(VRL-Vx) \quad (2)$$

The charges represented in the formulas (1) and (2) are equal to each other based on the law of conservation of charge, and thus Q0=Q1. Based on this relationship, the following formula (3) is derived:

$$Vx=\{(VRH+VRL)/2\}-VIN+VCM \quad (3)$$

The formula (3) may be rewritten into the following formula (4):

$$Vx-VCM=\{(VRH+VRL)/2\}-VIN \quad (4)$$

The threshold value of the comparator 12 is the reference potential VCM, and thus the comparison between Vx and the reference potential VCM in the comparator means the determination as to whether (Vx−VCM) at the left-hand side of the formula (4) is positive or negative. Accordingly, from the formula (4), the determination of the comparator 12 means the comparison between the middle voltage (VRH+VRL)/2 of the reference voltages VRH and VRL and the analog input voltage VIN. That is, in accordance with a determination result as to whether the left-hand side of the formula (4) is negative, that is, (VIN>(VRH+VRL)/2), or the left-hand side of the formula (4) is positive, that is, (VIN<(VRH+VRL)/2), it is determined whether the most significant bit (MSB) of the digital value Dout is equal to 1 or 0.

Next, for the determination of the second upper-side bit MSB-1, the switch for the capacitor C7 is kept to the high reference voltage VRH for VIN<(VRH+VRL)/2, or switched to the low reference voltage VRL for VIN>(VRH+VRL)/2, and the switch for the second highest-side C6 is coupled to the high reference voltage VRH side. The switches for the other capacitors Cd, C0 to C5 are coupled to the low reference voltage VRL side. That is, the SAR logic circuit 16 generates the control signal $\phi c$ for controlling ON/OFF of the switch group SWg in accordance with the determination result of the most significant bit (MSB). Accordingly, the comparison (determination) as to whether the input VIN is larger or smaller than 3(VRH+VRL)/4 or the comparison (determination) as to whether the input VIN is larger or smaller than 1(VRH+VRL)/4 is performed in the comparator 12, thereby determining the second upper-side bit.

Likewise, the comparison between the potential of the common terminal Vx and the reference voltage VCM is repeated while the potential of the common terminal Vx is gradually moved closer to the reference voltage VCM by the switching operation of the switch group SWg based on the control signal $\phi c$. When the determination of the least significant bit (LSB) is finished, the SAR logic circuit 16 outputs a digital output signal Dout of 8 bits.

Figure 3:
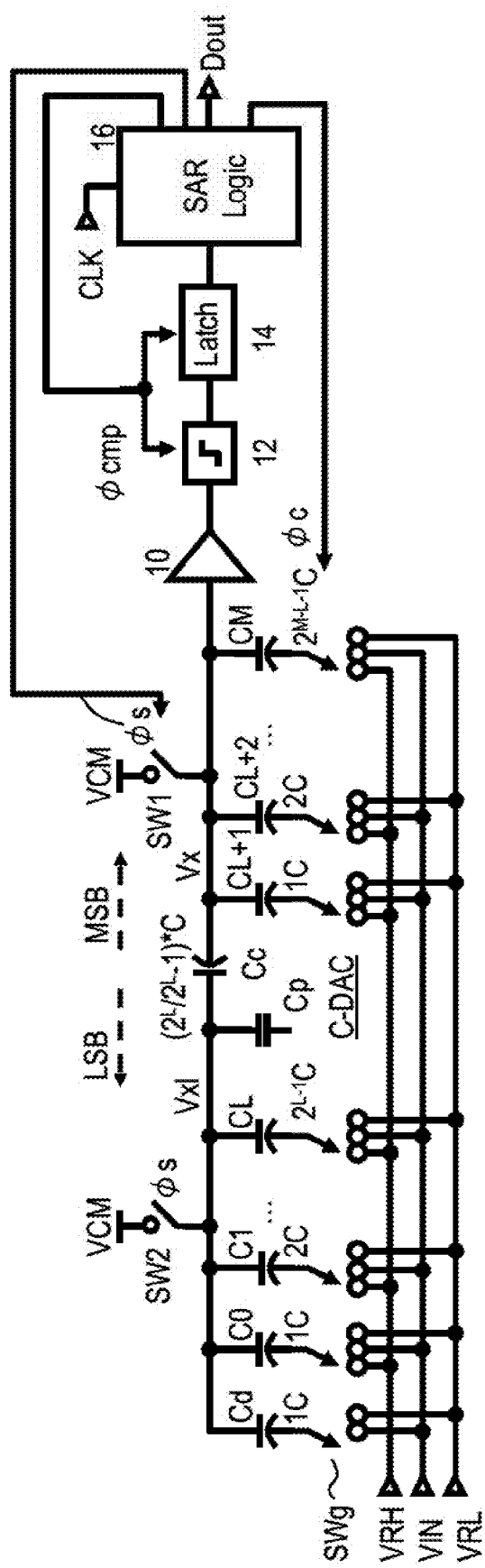
FIG. 3 illustrates another example of the successive approximation ADC.

FIG. 3 is a diagram illustrating another construction of the successive approximation ADC.

In the case of FIG. 1, the built-in DAC has the capacitor C7 whose capacitance value is equal to 128C at maximum. In the DAC of the successive approximation ADC of FIG. 3, the capacitor group is divided into a capacitor group at the lower side (lower-side LSBs of L) and a capacitor group at the upper side (upper-side MSBs of (M-L)), and the capacitors C0 to CL of the lower-side capacitor group and the capacitors CL+1 to CM of the upper-side capacitor group have capacitance values 1C, 2C, to 2L-1C, 1C, 2C, to 2M-L-1C which are weighted by binary rates. A coupling capacitor Cc is provided between the common terminal Vxl at the lower side and the common terminal Vx at the upper side. The lower-side capacitor group has a dummy capacitor Cd. In this case, the capacitance value of the coupling capacitor Cc is equal to (2L/2L−1)*C. The other construction is the same as ADC illustrate in FIG. 1.

By providing the coupling capacitor Cc as described above, the effect of the potential variation at the common terminal Vxl of the lower-side capacitor group on the common terminal Vx of the upper-side capacitor group is the same as the ADC illustrated in FIG. 1. The total capacitance value of the capacitor group is smaller than that of the example of FIG. 1. The operation of the successive approximation of FIG. 3 is similar to that of FIG. 1.

Figure 4:
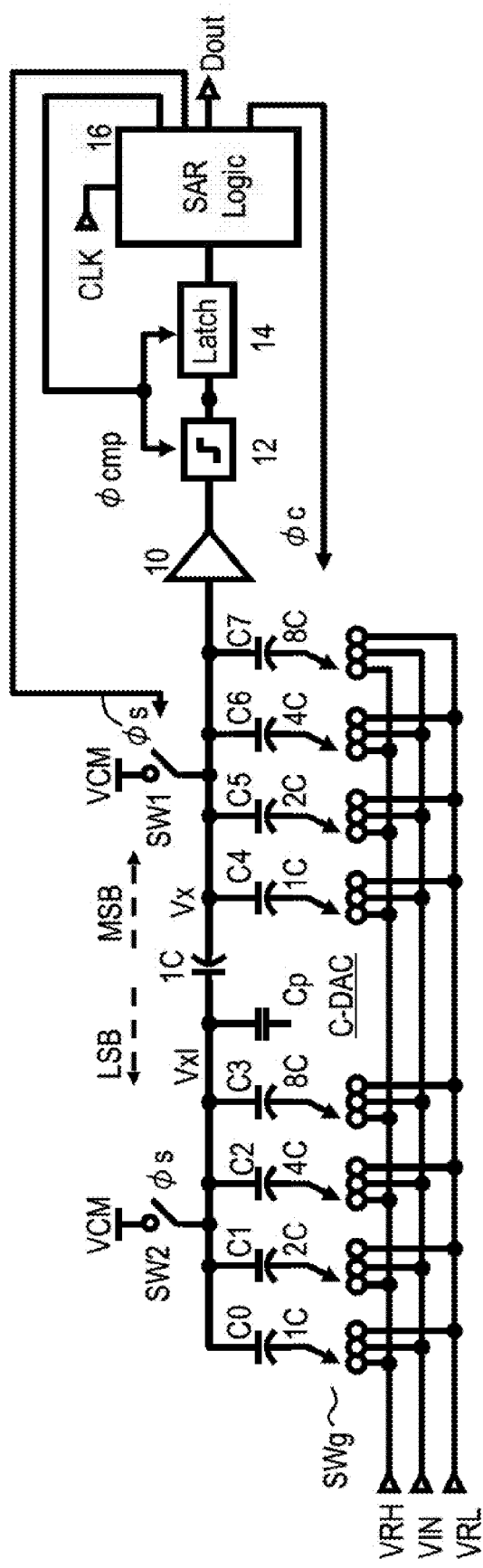
FIG. 4 illustrates another example of the successive approximation ADC.

FIG. 4 is a diagram illustrating another construction of the successive approximation ADC. This successive approximation ADC is different from that of FIG. 3 in that a dummy capacitor is not provided, the capacitor group is divided into four lower-side LSBs C0 to C3 and four upper-side MSBs C4 to C7, and the capacitance value of the coupling capacitor Cc is equal to 1C, and the other construction is similar to that of FIG. 3. Since no dummy capacitor is provided, the capacitance value of the coupling capacitor Cc may be set to a unit capacitance value 1C, and thus it is unnecessary to set the capacitance value to (2L/2L−1)*C as illustrated in FIG. 3.

When the DAC illustrated in FIG. 4 is formed in the integrated circuit device, parasitic capacitance is formed everywhere in the capacitor group. In FIG. 4, a parasitic capacitor Cp is illustrated in parallel to the capacitor group C0 to C3 of the lower-side LSBs. Accordingly, even when the capacitance value of the coupling capacitor Cc is set to 1C, the potential variation of the common terminal Vxl due to the capacitor group C0 to C3 of the lower-side LSBs is transmitted to the common terminal Vx of the upper-side MSBs while weakened due to the existence of the parasitic capacitor Cp. That is, the weighting value to be added to the common terminal Vx at the upper side by the potential variation of the common terminal Vxl at the lower side is smaller than a theoretical value due to the effect of the parasitic capacitor Cp.

Likewise, with respect to the DAC of FIG. 3, even when the capacitance value of the coupling capacitor Cc is set to (2L/2L−1)*C, the potential variation of the common terminal Vxl due to the capacitor group of the lower-side LSBs is also transmitted to the common terminal Vx of the upper-side MSBs while weakened to be smaller than the weighting value of the theoretical value due to the existence of the parasitic capacitor Cp.

In FIGS. 3 and 4, a parasitic capacitor also exists in the capacitor group at the upper-side MSBs.

When the potential variation of the common terminal Vxl of the lower-side capacitor group is not transmitted in conformity with the theoretical value to the common terminal Vx of the upper-side capacitor group, the step of the analog output voltage between the lower-side bit and the upper-side bit is different from the voltage step between the other bits, and thus the precision of the discrete analog output voltage Vx generated by the DAC is degraded.

Figure 5:
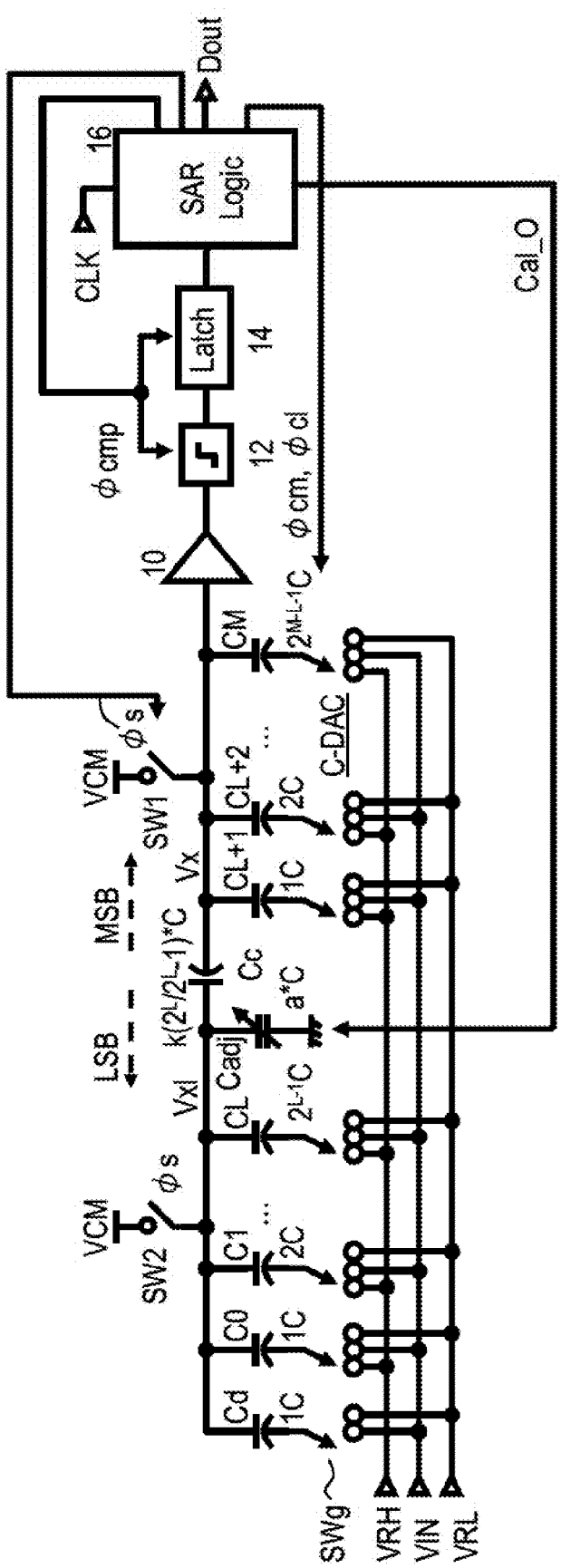
FIG. 5 illustrates a successive approximation ADC according to a first embodiment.

FIG. 5 is a diagram illustrating the construction of the successive approximation ADC according to the first embodiment. This ADC has the DAC of the first embodiment. The other constituent elements such as the buffer amplifier 10, the comparator 12, the latch circuit 14, and the SAR logic circuit 16 are identical to those of FIGS. 1 to 4. However, in the DAC, an adjusting capacitor Cadj is coupled to the common terminal Vxl and provided in parallel to the capacitor group of the lower-side LSBs. The SAR logic circuit 16 generates a calibration control signal Cal_0, and adjusts the capacitance value of the adjusting capacitor Cadj.

The DAC of FIG. 5 has a capacitor group having a dummy capacitor Cd and a coupling capacitor Cc as in the case of DAC of FIG. 3. However, the capacitance value of the coupling capacitor Cc is set to a value k(2L/2L−1)*C (k>1) which is larger than (2L/2L−1)*C. An adjusting capacitor Cadj is also provided in parallel to the lower-side capacitor group. The capacitance value of this adjusting capacitor Cadj is variable based on the control signal Cal_O, and the capacitance value after the adjustment is equal to a*C.

A parasitic capacitor Cp as illustrated in FIG. 3 also exists in the DAC of FIG. 5. This parasitic capacitor Cp may be included in the adjusting capacitor Cadj. The potential variation of the common terminal Vxl of the lower-side capacitor group is weakened by the parasitic capacitor Cp of the lower-side capacitor group and then transmitted to the common terminal Vx of the upper-side capacitor group. That is, the existence of the parasitic capacitor brings the weighting value of the lower-side capacitor group with an error so that the weight value concerned is smaller than the theoretical value.

In the DA converter of FIG. 5, the capacitance value of the coupling capacitor Cc is set to a value larger than the theoretical value as described above, whereby the weighting value of the lower-side capacitor group is set to be larger than the theoretical value. Furthermore, by adjusting the capacitance value of the adjusting capacitor Cadj, the parasitic capacitance Cp of the lower-side capacitor group may be substantially increased, and the weighting value based on the potential variation of the common terminal Vxl of the lower-side capacitor group may be adjusted to a lower value. By this adjustment, the weighting value of the lower-side capacitor group may be made coincident with the theoretical value.

Figure 6:
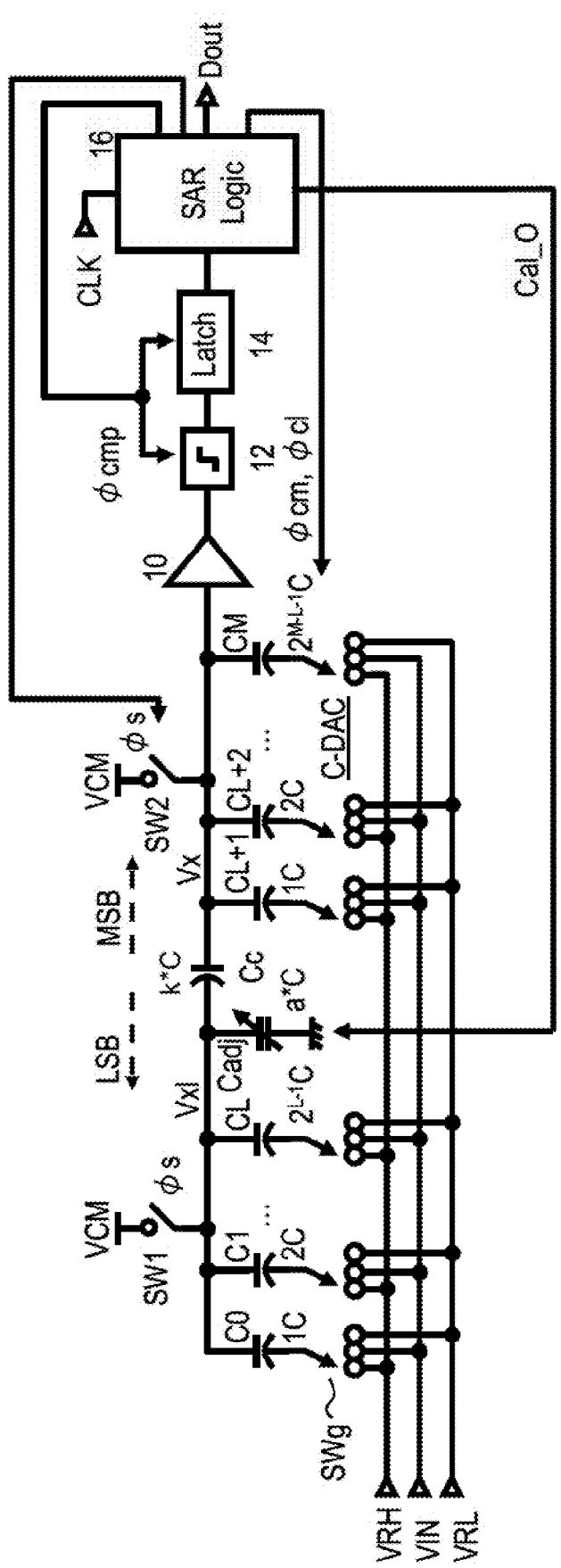
FIG. 6 illustrates another successive approximation ADC according to the first embodiment.

FIG. 6 is a diagram illustrating the construction of another successive approximation ADC of the first embodiment. This ADC has the DAC of the first embodiment. This DAC has no dummy capacitor Cd as in the case of the DAC of FIG. 4. The common terminal Vxl of the capacitor group of the lower-side LSBs is coupled to the common terminal Vx of the capacitor group of the upper-side MSBs by the coupling capacitor Cc. The DAC has an adjusting capacitor Cadj coupled to the common terminal Vxl. The adjusting capacitor Cadj is provided in parallel to the capacitor group of the lower-side LSBs. Also, the SAR logic circuit 16 generates a calibration control signal Cal_O and adjusts the capacitance value of the adjusting capacitor Cadj. However, the capacitance value of the coupling capacitor Cc is set to k*C (k>1) larger than the theoretical value 1C, the capacitance value of the adjusting capacitor Cadj is made variable by the control signal Cal_O, and the capacitance value after the adjustment is equal to a*C.

In the DAC of FIG. 6, based on the same principle as the DAC of FIG. 5, the weighting value of the lower-side capacitor group may be made coincident with the theoretical value by adjusting the capacitance value of the adjusting capacitor Cadj.

An adjusting operation of the capacitance value of the adjusting capacitor Cadj and a normal operation will be described by taking the example of the successive approximation ADC of FIG. 5.

FIGS. 7A, 7B and 7C are circuit diagrams for L=3 and M=7 in the successive approximation ADC of FIG. 5. In the DAC, the lower-side capacitor group has a dummy capacitor Cd and four capacitors C0 to C3, the upper-side capacitor group has four capacitors C4 to C7, and an analog voltage of 256 gradations is generated at the common terminal Vx in conformity with a control signal 4 cm of 8 bits. FIG. 7B is an ideal circuit diagram in which neither parasitic capacitor nor adjusting capacitor a*C exists, and FIG. 7C is a circuit diagram having an adjusting capacitor a*C containing a parasitic capacitor. In FIGS. 7B and 7C, the state where no charge is accumulated in the capacitor group is referred to as an initial state. When a reference voltage VRH=1V is applied to the electrodes of capacitors having a total capacitance value of nC in the lower-side capacitor group from the initial state, it may be found that the charge amount when the potential variation of the common terminal Vxl of the lower-side LSBs is transmitted to the common terminal Vx of the upper-side MSBs is substantially equal between the circuit diagrams of FIGS. 7B and 7C.

In FIG. 7B, VRL (=0V) is applied to all the electrodes of the lower-side capacitor group at the opposite side to the common terminal Vxl of the lower-side capacitor group under the initial state, both the switches SW1 and SW2 are set to ON to apply the reference voltage VCM=0V to the common terminal Vxl, Vx, and thus the charge Q=0. When both the switches SW1 and SW2 are set to OFF and the reference voltage VRH=1V is applied to the electrodes of capacitors having a total capacitance value nC out of the electrodes at the opposite side of the lower-side capacitor group, the charge Q has the following relationship: Q=nC(Vxl−1)+{(16−n)C+Cc}Vxl=0. By solving this relational expression, Vxl=nC/(16C+Cc). This potential variation Vxl is transmitted through the coupling capacitor Cc to the common terminal Vx of the upper-side capacitor group, and thus the transmitted charge amount Q is as follows:

$$Q=Vxl*Cc=\{nC/(16C+Cc)\}*Cc \quad (5)$$

On the other hand, in FIG. 7C, the adjusted capacitance aC of the adjusting capacitor Cadj is added, and the coupling capacitor Cc is equal to kCc. Therefore, the charge Q has the following relationship: Q=nC(Vxl−1)+{(16−n)C+kCc+aC}Vxl=0. By solving this relational expression, Vxl=nC/(16C+kCc+aC). This potential variation Vxl is transmitted through the coupling capacitor Cc to the common terminal Vx of the upper-side capacitor group. Therefore, the transmitted charge amount Q is as follows:

$$Q=Vxl*Cc=\{nC/(16C+kCc+aC)\}*kCc \quad (6)$$

If the charges in the formulas (5) and (6) are equal to each other, the voltage at the common terminal Vx of the upper-side capacitor group of FIG. 7C is equal to the voltage of the common terminal Vx of the upper-side capacitor group of FIG. 7B under the ideal state. Accordingly, by solving (5)=(6), a=16(k−1) is obtained. That is, if the adjusting capacitor Cadj containing the parasitic capacitance is adjusted to a*C=16(k−1)*C, the error of the upper-side common terminal Vx due to the parasitic capacitance may be reduced if not eliminated.

A calibration procedure of the adjusting capacitor Cadj of the DAC in the successive approximation ADC of FIG. 7A will be described. Under the ideal state, the composite capacitance of the capacitor group of the lower-side LSBs Cd, C0 to C3, Cadj and the coupling capacitor Cc is equal to the minimum capacitance C of the capacitor group of the upper-side MSBs C4 to C7.

In the calibration procedure, under a state where the capacitance value of the adjusting capacitor Cadj is set to any value by the control signal Cal_O, the switches SW1 and SW2 are set to ON so that the common terminals Vxl and Vx are set to the reference voltage VCM (=0), and the input digital value φcl at the lower side is set to 0 (00000) or 1 (11111), and the input digital value φcm at the upper side is set to any digital value. Under this state, the common terminal Vx is set to the reference voltage VCM. Thereafter, the switches SW1 and SW2 are set to OFF, and the input digital value φcl at the lower side is switched to 1 or 0, and the input digital value φcm at the upper side is switched to be smaller or larger by only the minimum value. At this switching time, the capacitance value of the adjusting capacitor Cadj at which the potential variation of the common terminal Vx is minimum, preferably equal to zero is determined. Specifically, a point at which the comparison result of the comparator 12 is switched from L to H or from H to L is searched while the capacitance value of the adjusting capacitor Cadj is successively varied in accordance with the comparison result of the comparator 12.

Figure 8:
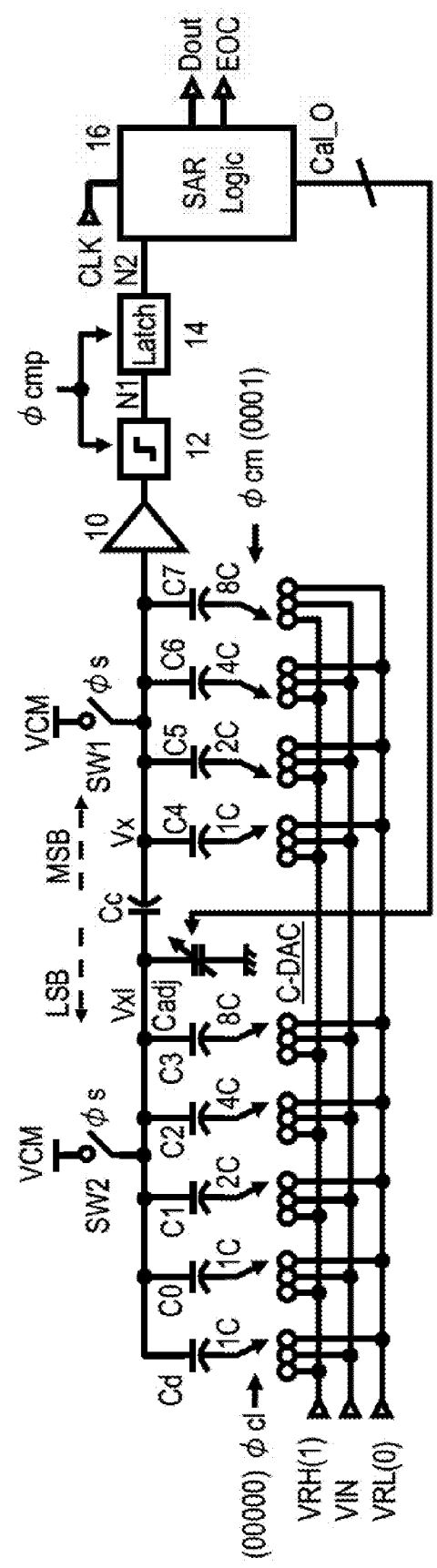
FIG. 8 is a diagram illustrating a switch state of a period P2 of the ADC illustrated in FIG. 5.
Figure 9:
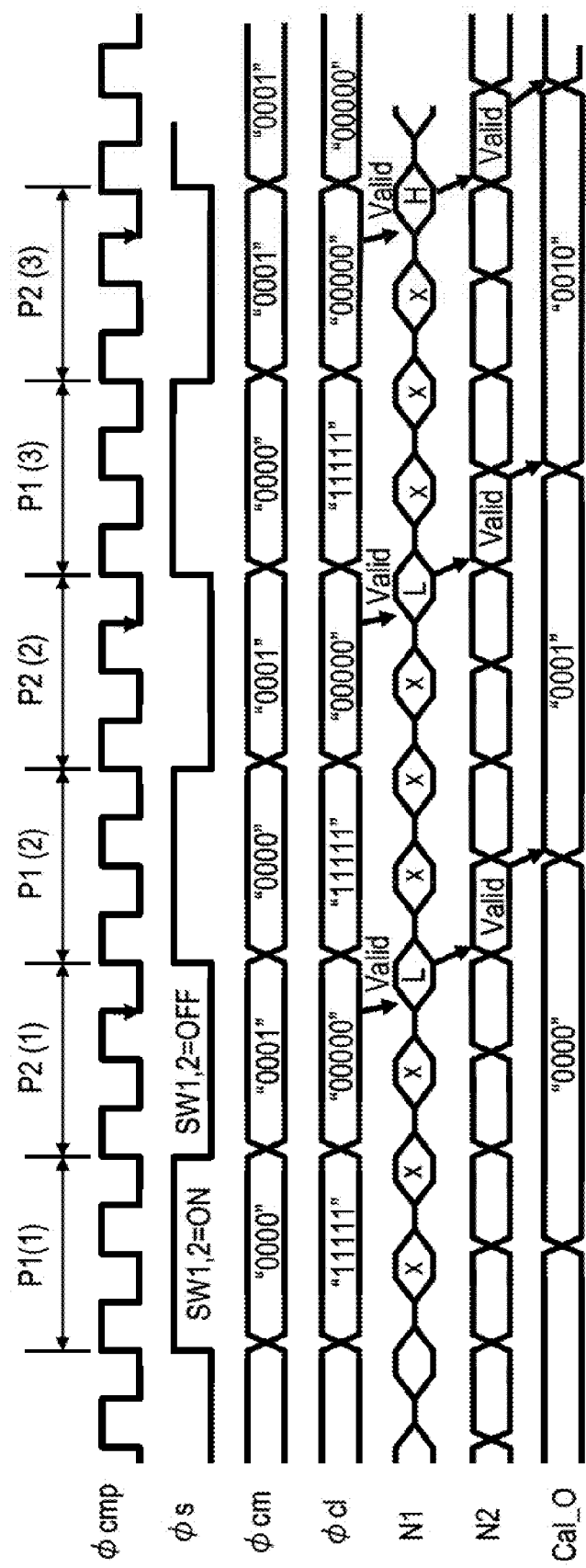
FIG. 9 is a timing chart illustrating a calibration process.

The above calibration procedure will be specifically described with reference to FIGS. 7A, 8, and 9. FIG. 9 is a timing chart illustrating the calibration procedure, FIG. 7A is a switch state of a period P1, and FIG. 8 is a switch state of a period P2.

During the period P1(1), the control signal φs is set to High (H) level, the switches SW1 and SW2 are set to ON, the lower-side digital input φcl is reset to "11111" and the upper-side digital input φcm is reset to "0000". The first calibration control signal Cal_0 is set to "0000". Under this state, a charge of 16C*VRH is accumulated in the lower-side capacitor group. This charge corresponds to the minimum value of the digital input φcm of the upper-side capacitor group.

During the period P2(1), the control signal φs is set to Low (L) level, the switches SW1 and SW2 are set to OFF, the lower-side digital input φcl is switched to "00000" and the upper-side digital input φcm is switched to "0001". Accordingly, in the lower-side capacitor group, the charge of 16C*VRH is reduced, however, in the upper-side capacitor group, the charge of C*VRH is increased. The magnitude relation between the voltage drop of the common terminal Vx caused by the decrease of the charge at the lower side and the voltage increase of the common terminal Vx caused by the increase of the charge at the upper side is detected at the output of the comparator 12.

When the capacitance value of the adjusting capacitor Cadj is insufficient, the weighting value at the lower side is larger, and the decrease of the common terminal Vx caused by the decrease amount of the charge at the lower side exceeds the increase of the common terminal Vx caused by the increase amount of the charge at the upper side, so that the output N1 of the comparator 12 is set to L level. In the timing chart of FIG. 9, the calibration control signal Cal_O is first set to "0000", and the capacitance value of the adjusting capacitor Cadj is insufficient, so that the output N1 of the comparator 12 is set to L level.

When the output N1 of the comparator 12 is set to L level, the capacitance value of the adjusting capacitor Cadj is increased, and the same operation that was carried out during the periods P1 and P2 is repeated. That is, the calibration control signal Cal_O is increased to "0001", and the operations during the periods P1(2), P2(2) are carried out.

During the period P1(2), the same resetting operation as the period P1(1) is carried out. In the period P1(2), the same switching operation as the period P2(1) is carried out. At this time, the output N1 of the comparator 12 is set to L level. That is, the capacitance value of the adjusting capacitor Cadj is still insufficient. When N1 is set to L level, the calibration control signal Cal_O is increased to "0010", and the operations of the period P1(3) and P2(3) are carried out.

During the period P1(3), the same resetting operation as during the period P1(1) is carried out. During the period P2(3), the same switching operation as during the period P2(1) is carried out. At this time, the output N1 of the comparator 12 is set to H level. That is, the magnitude relation is substantially balanced between the voltage drop of the common terminal Vx caused by the decrease of the charge at the lower side and the voltage increase of the common terminal Vx caused by the increase of the charge at the upper side. Therefore, the calibration control signal Cal_O is set to "0001" or "0010" before or after the output N1 of the comparator is switched. Accordingly, the capacitance value of the adjusting capacitor Cadj is adjusted to the capacitance value corresponding to the set calibration control signal.

In the above calibration procedure, at the switching time from the period P1 to the period P2, the upper-side digital value φcm may be reduced by only the minimum value. For example, φcm may be varied from "1000" to "0111".

Furthermore, in the above procedure, when the period P1 is switched to the period P2, the lower-side digital value φcl may be switched from "00000" to "11111" and the upper-side digital value φcm may be increased by only the minimum value. For example, φcm may be changed from "01111" to "10000". With respect to the upper-side digital value φcm, the calibration precision is enhanced when the center value of 16 bits, that is, "7" is changed to "8" or "8" is changed to "7".

Furthermore, in the above calibration procedure, the calibration control signal Cal_O may be started from the center value "1000", and increased or reduced in accordance with the level of the output N1 of the comparator 12. In this case, the search frequency may be minimized stochastically.

Figure 10:
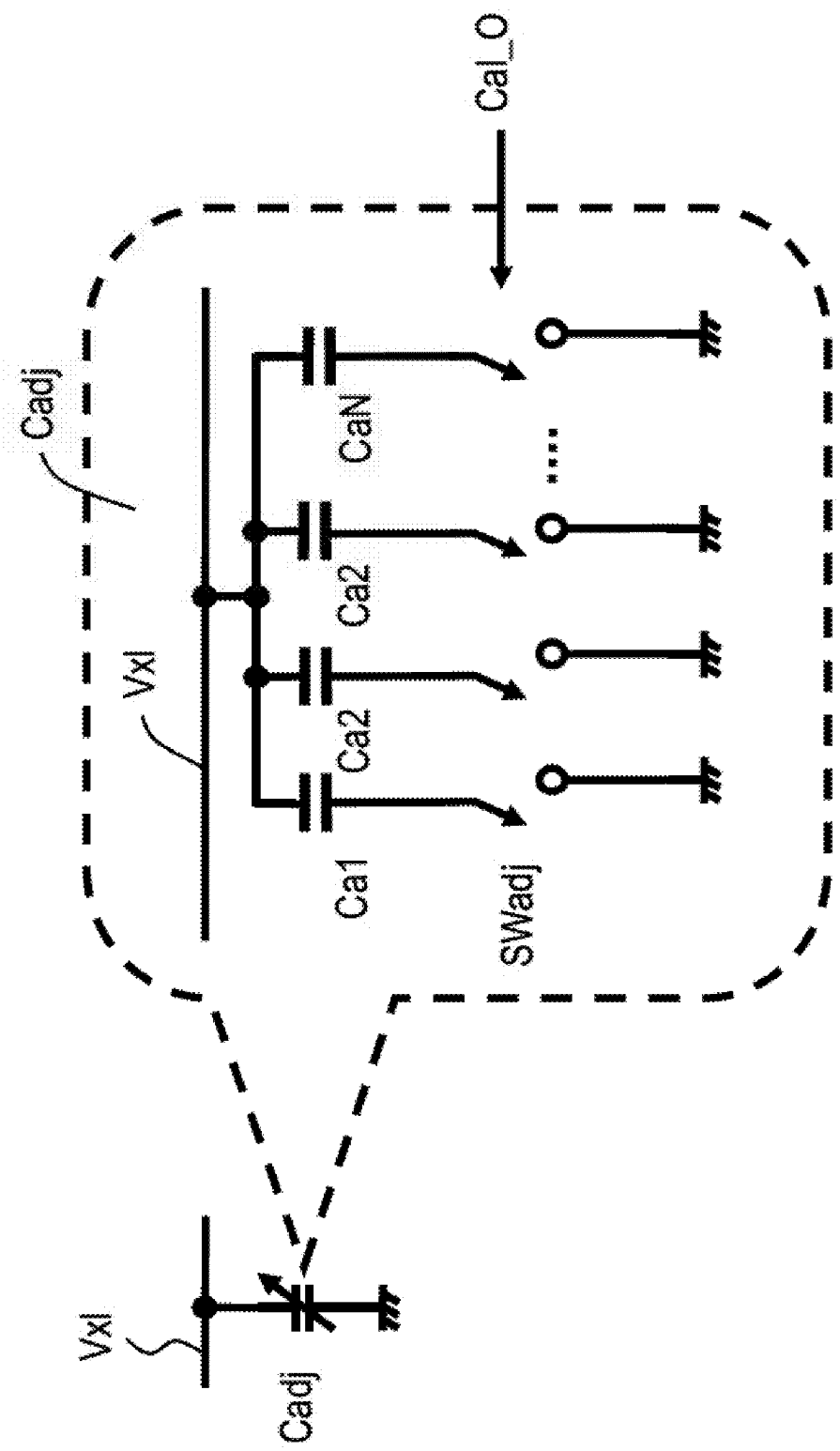
FIG. 10 illustrates an example of an adjusting capacitor in the first embodiment.

FIG. 10 is a circuit diagram illustrating an example of the adjusting capacitor Cadj in the first embodiment. The adjusting capacitor Cadj has a plurality of capacitors Ca1 to CaN and a switch group SWadj which are arranged in parallel between the common terminal Vxl and the ground terminal. The plurality of capacitors Ca1 to CaN may have the same capacitance value or capacitance values which are weighted by a binary rate. The switch group SWadj is controlled to be switched on or off in accordance with the signal of each bit of the calibration control signal Cal_O. When all the bits of the calibration control signal Cal_O are set to 0, all the switches of the switch group SWadj are set to OFF, and thus the capacitance value of the adjusting capacitor Cadj is minimum. On the other hand, when all the bits of the calibration control signal Cal_O are set to 1, all the switches of the switch group SWadj are set to ON, so that the capacitance value of the adjusting capacitor Cadj is maximum.

Figure 11:
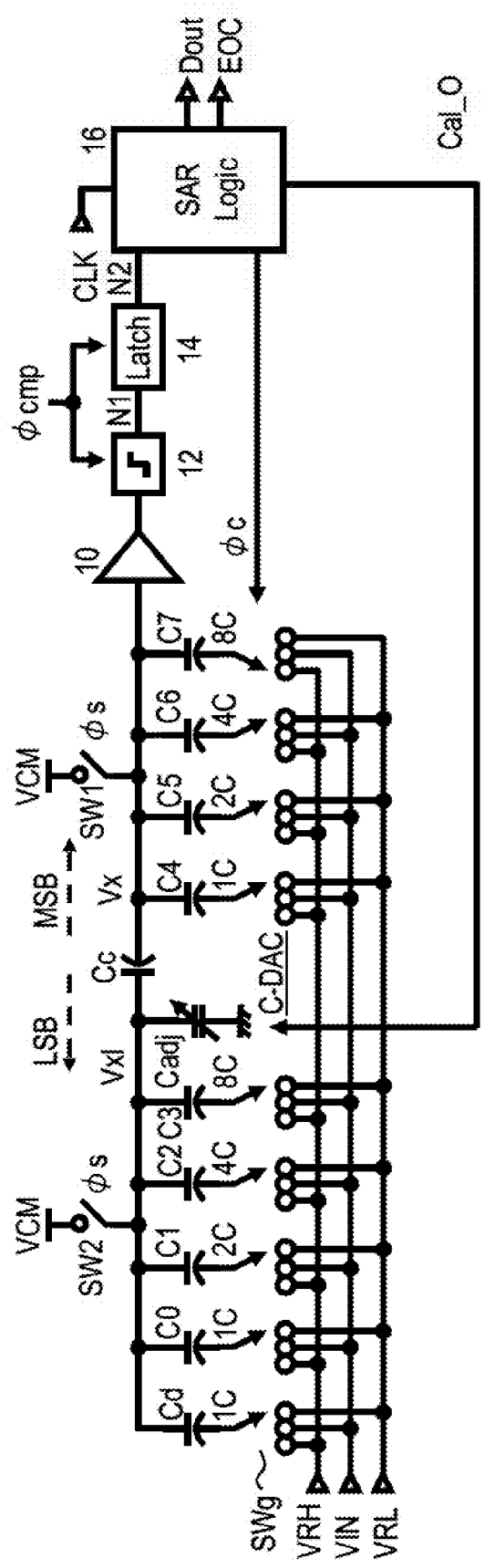
FIG. 11 illustrates a state of a switching group under a normal operation of the successive approximation ADC in the first embodiment.
Figure 12:
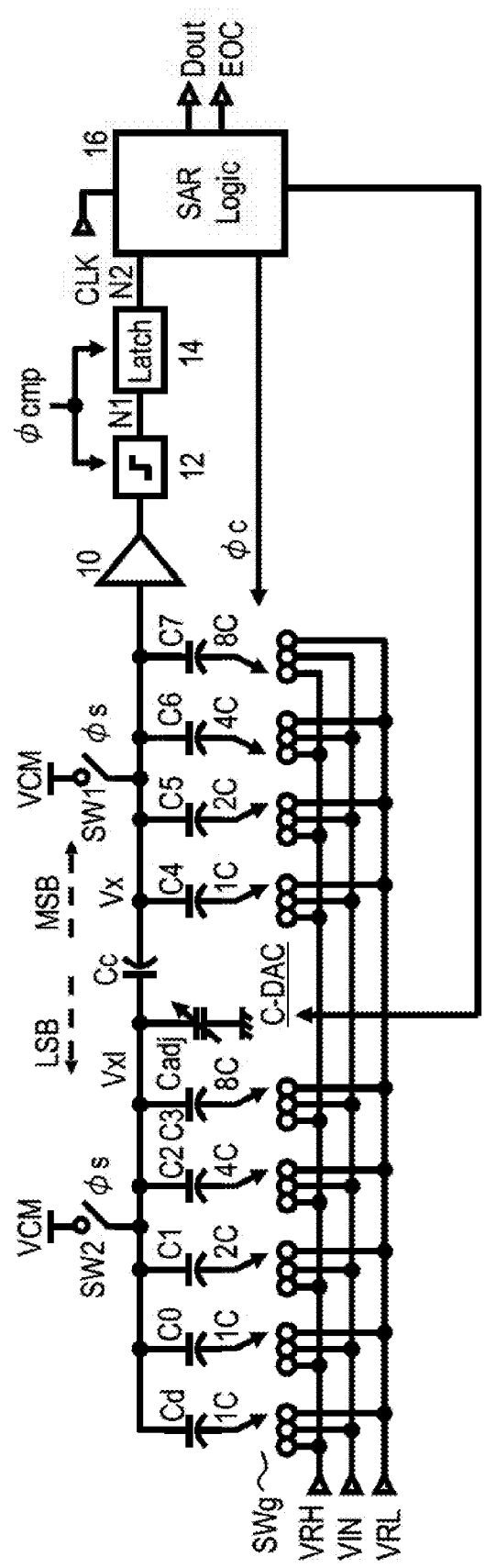
FIG. 12 illustrates a state of the switching group under the normal operation of the successive approximation ADC in the first embodiment.
Figure 13:
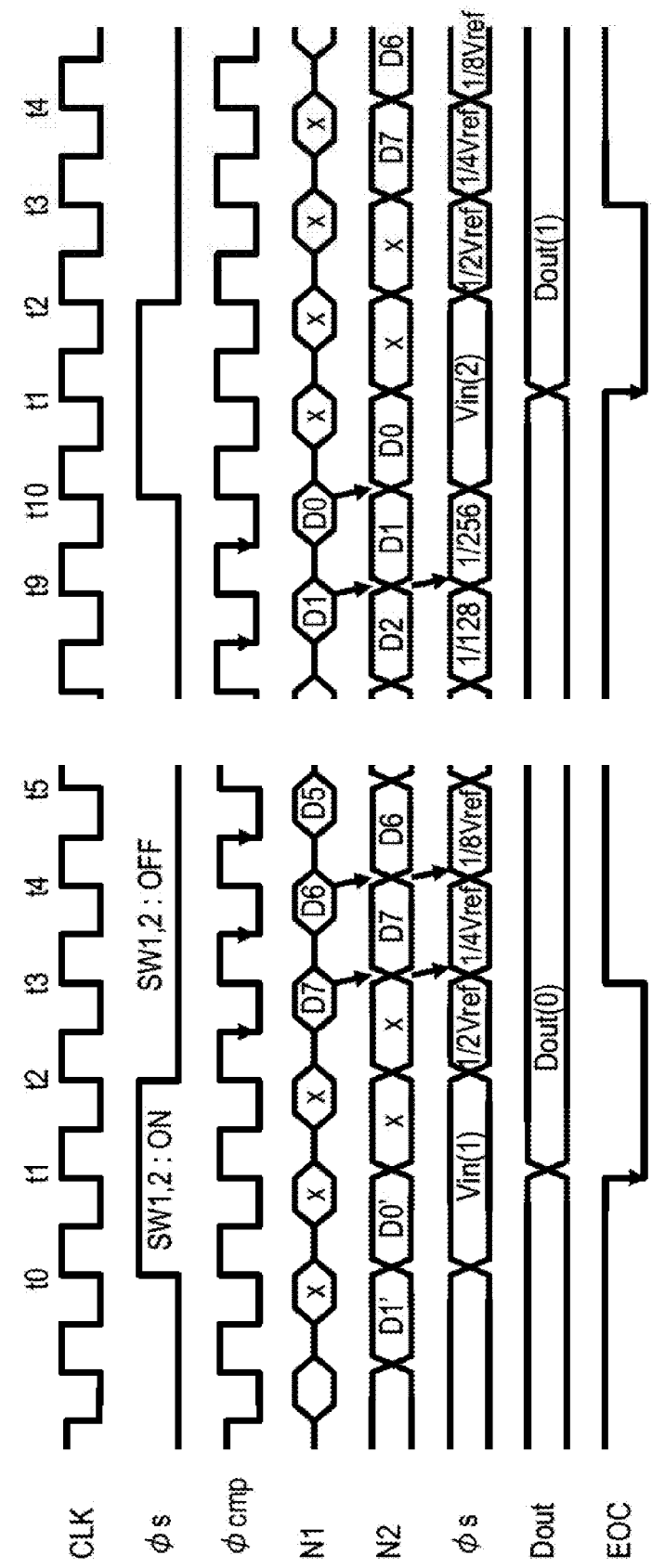
FIG. 13 is a timing chart of the normal operation.

FIGS. 11 and 12 are diagrams illustrating the state of the switch group in the normal operation of the successive approximation ADC in the first embodiment. FIG. 13 is a timing chart illustrating the normal operation of the successive approximation ADC illustrated in FIG. 12. The normal operation of the successive approximation ADC will be described with reference to FIG. 13.

At the time t0, and t1, the SAR logic circuit 16 couples all the switches of the switch group SWg to the terminal side of the analog input voltage VIN by the control signal φc, and the switches SW1 and SW2 are set to ON by the control signal φs. Accordingly, the voltage between the analog input voltage VIN and the reference voltage VCM is applied to all the capacitors Cd, C1 to C7, and the corresponding charges are accumulated in the capacitors.

Subsequently, the bit determination of the most significant bit is carried out at the time t2. That is, as illustrated in FIG. 11, the switches SW1 and SW2 are set to OFF, and the switch SWg corresponding to the capacitor C7 at the highest side, that is, the capacitor C7 corresponding to the most significant bit, is coupled to the high reference voltage VRH side while all the switches SWg corresponding to the other remaining capacitors are coupled to the low reference voltage VRL side. Accordingly, the voltage illustrated in the formula (3) is generated at the common terminal Vx.

In response to the L level of the control signal φcmp, the comparator 12 determines whether the voltage of the common terminal Vx is higher or lower than the reference voltage VCM, the latch circuit 14 latches a determination result N1 and the latch data N2 are input to the SAR logic circuit 16. According to the formula (3), the determination result N1 or N2 means a determination result as to whether the analog input voltage VIN is larger or smaller than the intermediate value between the high reference voltage VRH and the low reference voltage VRL (i.e., (VRH+VRL)/2). Accordingly, this determination result corresponds to the most significant bit of the digital output signal Dout. In FIG. 13, the control signal φc is described as 1/2Vref, and 1/2Vref corresponds to (VRH+VRL)/2.

Subsequently, at the time t3, the bit determination for the next upper-side bit is carried out. In accordance with the above determination result, the switch SWg corresponding to the capacitor C7 of the most significant bit is coupled to either the high reference voltage VRH or the low reference voltage VRL by the control signal φc, and the switch SWg corresponding to the capacitor C6 of the next upper-side bit (second highest bit) is set to the low reference voltage VRL side.

If Vx−VCM>0, that is, VIN<(VRH+VRL)/2 is satisfied at the time t2, the determination result N1 of the most significant bit indicates "H level", and the switch SWg corresponding to the capacitor C7 is coupled to the high reference voltage VRH at the time t3. In the reverse case, the determination result N1 indicates "L level", and the switch SWg corresponding to the capacitor C7 is coupled to the low reference voltage VRL. Under the state of FIG. 12, the switch SWg corresponding to the capacitor C7 is coupled to the high reference voltage VRH.

As illustrated in FIG. 12, when the switch SWg corresponding to the capacitor C7 is coupled to the high reference voltage VRH, the formula (3) satisfies the following formula:

$$Vx=\{(VRH+VRL)/4\}-VIN+VCM \quad (3\text{-}1)$$

Accordingly, the determination result N1 of the comparator 12 corresponds to the determination result of the upper-side bit which is lower than the most significant bit by one. When the switch SWg corresponding to the capacitor C7 is coupled to the low reference voltage VRL, the formula (3) satisfies the following formula:

$$Vx=\{3(VRH+VRL)/4\}-VIN+VCM \quad (3\text{-}2)$$

In FIG. 13, at the time t3, the control signal φc is 1/4Vref. 1/4Vref corresponds to (VRH+VRL)/4 or 3(VRH+VRL)/4 of the formulas (3-1) and (3-2).

Likewise, at the time t4 to t9 of FIG. 13, the bit determination is successively repeated. When the bit determination for the least significant bit is finished at the time t9, the digital output signal Dout corresponding to the analog input voltage Vin(1) is ascertained. Then, a hold operation of a next analog input voltage Vin(2) is carried out from the time t10. At the time t11, the SAR logic circuit 16 sets an End of Conversion signal EOC to L level, notifies the circuit at the next stage of the completion of the conversion to the digital output signal of 8 bits, and also notifies that the digital output signal Dout is effective.

According to the first embodiment, the capacitance value of the adjusting capacitor Cadj is adjusted in the bit determination operation, and thus the weighting value applied to the upper-side bit side by the capacitor group of the lower-side bit side conforms to the theoretical value.

Figure 14:
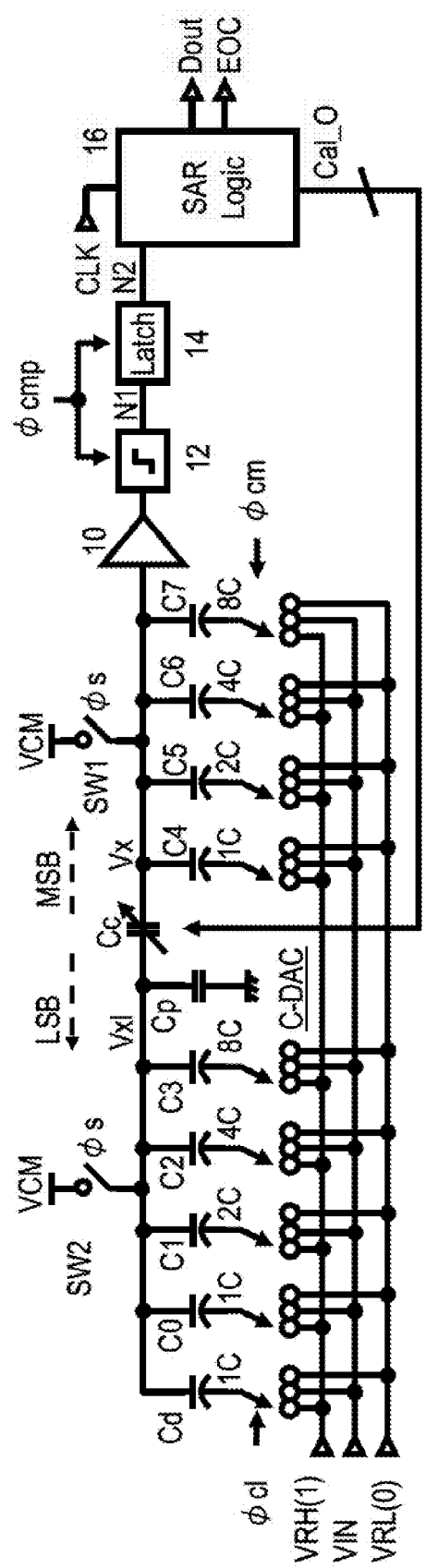
FIG. 14 illustrates a successive approximation ADC according to a second embodiment.
Figure 15:
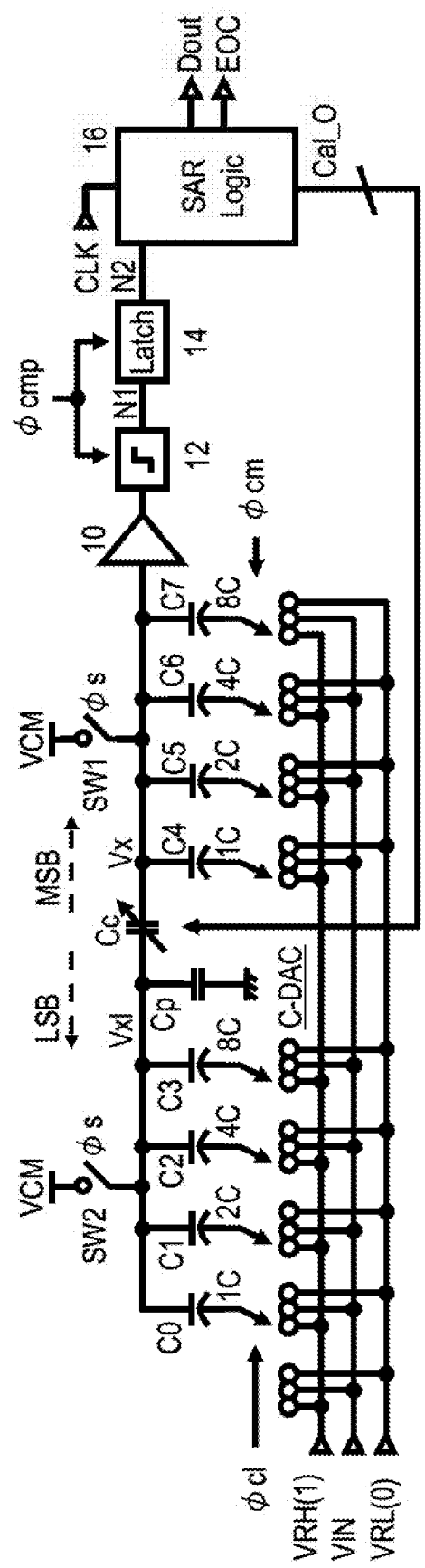
FIG. 15 illustrates a successive approximation ADC according to the second embodiment.

FIG. 14 is a diagram illustrating the construction of a successive approximation ADC according to a second embodiment. FIG. 15 is a diagram illustrating the construction of another successive approximation ADC of the second embodiment. In FIG. 14, the lower-side capacitor group has a dummy capacitor Cd, and in FIG. 15, the lower-side capacitor group has no dummy capacitor Cd.

In the DAC contained in the successive approximation ADC according to the second embodiment, the capacitance value of the coupling capacitor Cc is adjustable by the calibration control signal Cal_O.

As illustrated in FIGS. 14 and 15, the lower-side capacitor group has a parasitic capacitor Cp. The weighting value applied to the common terminal Vx of the upper-side capacitor group by the lower-side capacitor group is reduced by the parasitic capacitor Cp. The capacitance value of the coupling capacitor Cc is adjusted to be larger than the theoretical value, thereby offsetting the reduction of the weighting value due to the parasitic capacitor Cp. In principle, the weighting value at the lower side may be increased by increasing the capacitance value of the coupling capacitor Cc. Accordingly, in the calibration process, as in the case of FIG. 9, the SAR logic circuit 16 sets the capacitance value of the coupling capacitor Cc to some value based on the calibration control signal Cal_O, and obtains the determination result N1 of the comparator 12 in the period P2 after the period P1. In accordance with this determination result, the capacitance value of the coupling capacitor Cc is changed by the calibration control signal Cal_O. Thereafter, the operations of the periods P1 and P2 are repeated. The operations of the periods P1 and P2 are the same as those of FIG. 9. If the determination result N1 indicates "H level", the capacitance value of the coupling capacitor Cc is excessively low, and thus the weighting value applied by the lower side is small, so that the capacitance value of the coupling capacitor Cc is increased. On the other hand, if the determination result N1 indicates "L level", the capacitance value of the coupling capacitor Cc is reduced.

Figure 16:
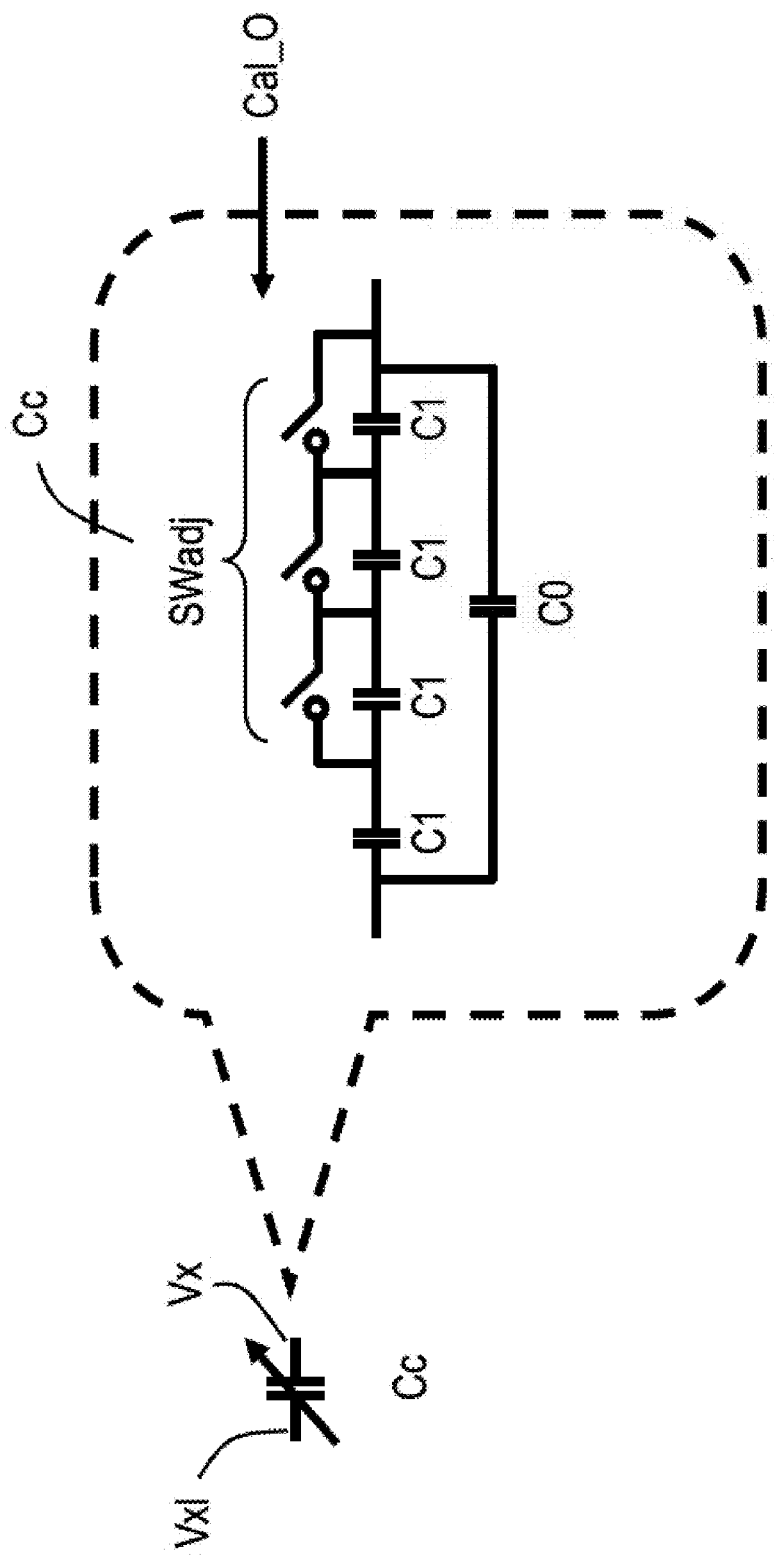
FIG. 16 illustrates a coupling capacitor in the second embodiment.

FIG. 16 is a circuit diagram illustrating the coupling capacitor Cc in the second embodiment. The coupling capacitor Cc of FIG. 16 has a main capacitor C0 having relatively large capacitance, sub capacitors C1 each of which has relatively small capacitance, and a switch group SWadj for short-circuiting the electrodes of some sub capacitors C1. The switch group SWadj is subjected to ON/OFF control by the calibration control signal Cal_O.

When all the switches of the switch group SWadj are set to ON, the coupling capacitor Cc includes the main capacitor C0 and one sub capacitor C1, and has the maximum capacitance value. On the other hand, when any switch of the switch group SWadj is set to OFF, the number of sub capacitors C1 increases, and thus the capacitance value of the coupling capacitor Cc decreases. When all the switches of the switch group SWadj are set to OFF, the capacitance value of the coupling capacitor Cc is minimum. As described above, the capacitance value of the coupling capacitor Cc may be controlled in accordance with the calibration control signal Cal_O of three bits.

Figure 17:
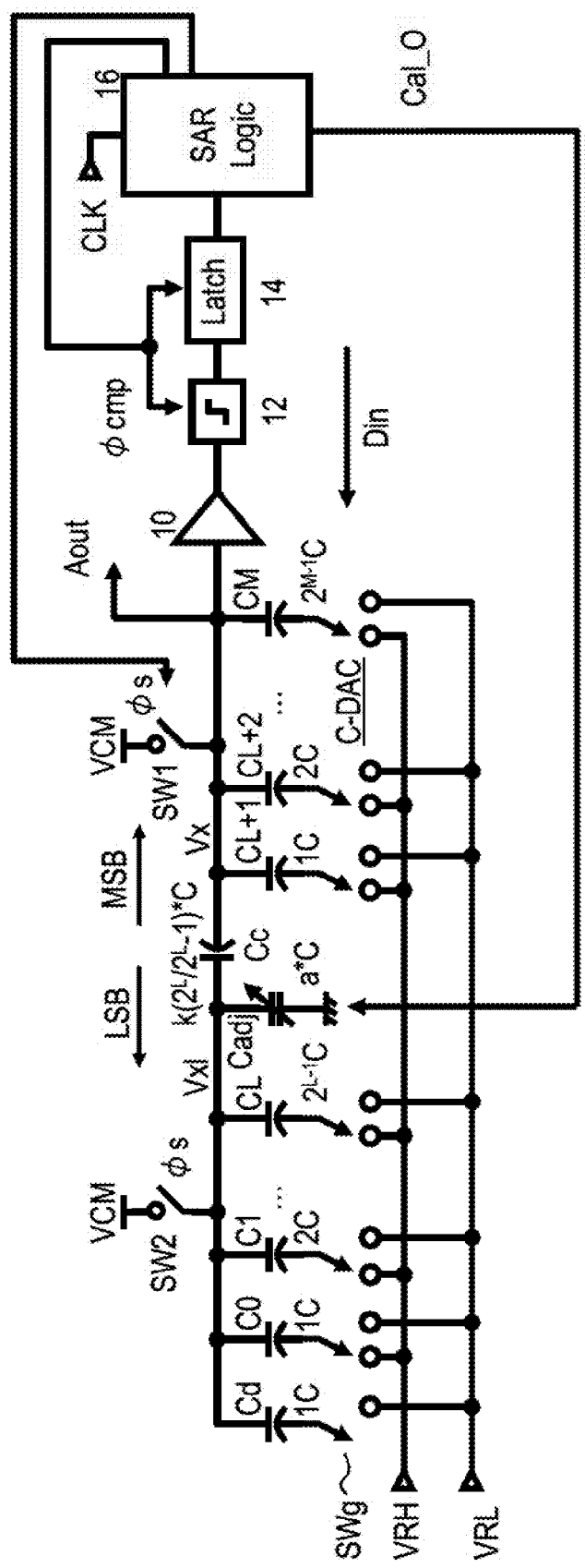
FIG. 17 illustrates a DAC in a third embodiment.
Figure 18:
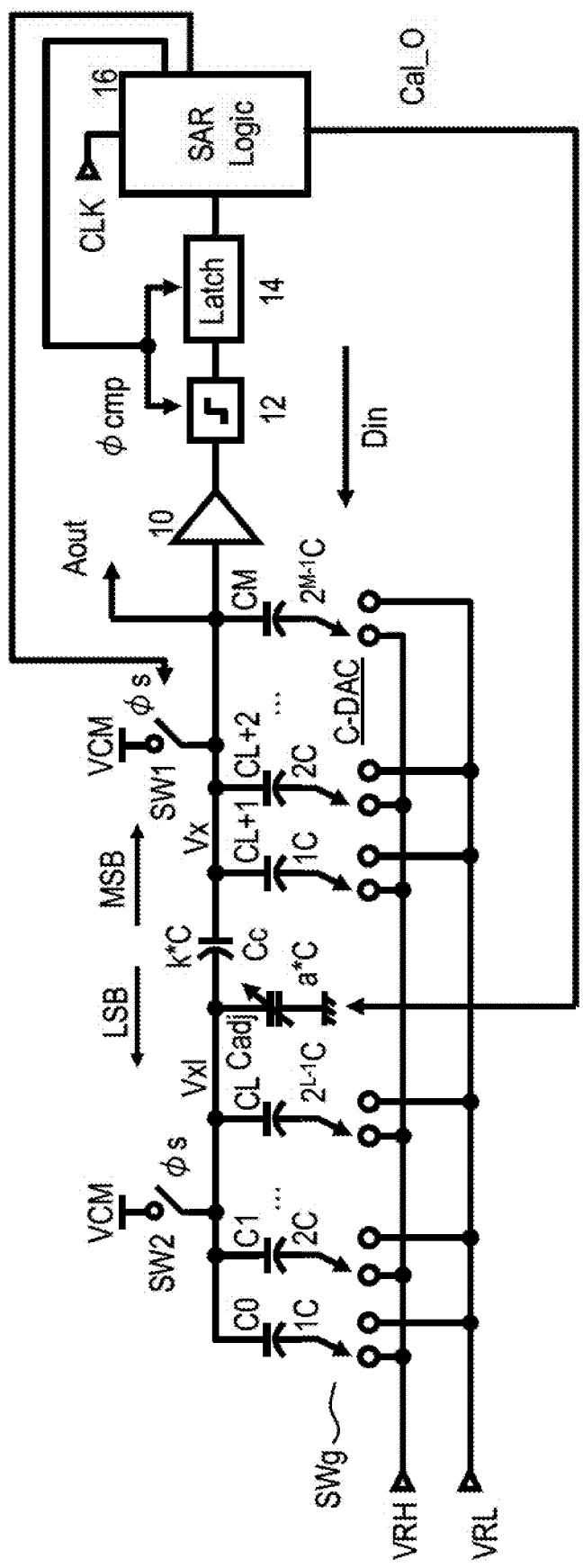
FIG. 18 illustrates another DAC in the third embodiment.

FIG. 17 is a diagram illustrating the construction of a DAC according to a third embodiment. FIG. 18 is a diagram illustrating the construction of another DAC according to the third embodiment. These DACs convert a digital input signal Din to an analog output signal Aout. Accordingly, these DACs have neither the terminal of the analog input VIN nor the digital output signal Dout unlike the successive approximation ADC described above, and the upper-side common terminal Vx is output as an analog output signal Aout. In FIG. 17, the lower-side capacitor group has a dummy capacitor Cd, and in FIG. 18, the lower-side capacitor group has no dummy capacitor.

In each DAC in FIGS. 17 and 18, the capacitance value of the adjusting capacitor Cadj is calibrated to the optimum value in the calibration process as in the same manner as described with reference to FIGS. 7, 8, and 9. In this calibration process, the buffer amplifier 10, the comparator 12, the latch circuit 14, the SAR logic circuit 16, and the calibration control signal Cal_O are used.

Furthermore, in the normal DA conversion operation, during a reset period, the switches SW1 and SW2 are controlled to be set to ON, and both the common terminals Vxl and Vx are set to the reference voltage VCM, for example, 0V. All the switches of the switch group SWg are coupled to the low reference voltage VRL, for example, 0V, and the terminals opposite to the common terminal of the capacitor group are set to the low reference voltage VRL. Subsequently, during a digital/analog conversion period, in accordance with a digital input signal Din of 8 bits, the switch group SWg is switched to the high reference voltage VRH for Din=1 and to the low reference voltage VRL for Din=0, for example. In response to this switching operation, the analog voltage corresponding to the digital input signal Din is generated at the common terminal Vx. The analog voltage Aout gradually increases from 0V as the digital input signal Din increases.

The DA conversion operation may generate the analog output signal Aout corresponding to the digital input signal Din by methods other than the above method. For example, all the switches of the switch group SWg may be coupled to the high reference voltage VRH side during the reset period. Or, only the most significant bit may be coupled to the high reference voltage VRH side during the reset period while the other bits are coupled to the low reference voltage VRL side.

In the DAC illustrated in FIGS. 17 and 18, the lower-side adjusting capacitor Cadj is provided. However, as illustrated in FIGS. 14 and 15, in the DAC, the coupling capacitor Cc may be designed so that the capacitance value thereof is adjustable in place of provision of the adjusting capacitor Cadj at the lower side.

Another example of the successive approximation analog digital converter (ADC) has a sample hold circuit for sampling and holding an analog input voltage, a DAC as described with reference to FIGS. 17 and 18, a comparator for detecting the magnitude relation between the analog output voltage generated in the DAC and the analog input voltage held in the sample hold circuit, and an SAR logic circuit for accumulating the comparison result of the comparator and controlling a digital input signal to the DAC in accordance with the comparison result. In this example, a comparison target voltage is generated as an analog output voltage at the common terminal Vx of the DAC.

As described above, according to the DACs of this embodiment, the capacitance value of the adjusting capacitor Cadj or coupling capacitor Cc provided at the lower side is adjusted in the calibration process so that the weighting value applied from the lower-side capacitor circuit to the upper-side capacitor circuit becomes an optimum value. Therefore, even when a parasitic capacitor is formed in the case of the construction based on LSI, DA conversion errors may be suppressed.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A digital analog converter comprising:
an input terminal receiving a digital input signal;
a lower-side capacitor group of capacitors having capacitance values weighted by a binary rate and coupled to a lower-side common terminal in parallel;
an upper-side capacitor group of capacitors having capacitance values weighted by a binary rate and coupled, in parallel, to an upper-side common terminal at which an analog output signal is generated;
a coupling capacitor provided between the lower-side common terminal and the upper-side common terminal;
a switch group of switches coupled to terminals of the lower-side capacitor group at opposite sides to the lower-side common terminal and coupled to terminals of the upper-side capacitor group at opposite sides to the upper-side common terminal, the switch group being controlled as a conduction state and a non-conduction state in accordance with the digital input signal; and
an adjusting capacitor coupled to the lower-side common terminal and having a variable capacitance value, wherein the capacitance value of the adjusting capacitor is adjusted so that a first potential and a second potential are equal to each other, the first potential being defined as a potential of the upper-side common terminal when upper-side bits of the digital input signal are set to a first upper-side bit value and lower-side bits of the digital input signal are set to a first lower-side bit value at which the values of all the bits of the lower-side bits are equal to 0 or 1, and the second potential being defined as a potential of the upper-side common terminal when the upper-side bits of the digital input signal are set to a second upper-side bit value which is different from the first upper-side bit value by only the minimum bit, and the lower-side bits of the digital input signal are set to a second lower-side bit value at which the values of all the bits of the lower-side bits are equal to 1 or 0.

2. The digital analog converter according to claim 1, wherein the first upper-side bit value is a center value of the possible range of the upper-side bits.

3. The digital analog converter according to claim 1, further comprising a dummy capacitor coupled to the lower-side common terminal and having a minimum-weighted capacitance value in the lower-side capacitor group.

4. A digital analog converter comprising:
an input terminal receiving a digital input signal;
a lower-side capacitor group of capacitors having capacitance values weighted by a binary rate and coupled to a lower-side common terminal in parallel;
an upper-side capacitor group of capacitors having capacitance values weighted by a binary rate and coupled, in parallel, to an upper-side common terminal at which an analog output signal is generated;
a coupling capacitor provided between the lower-side common terminal and the upper-side common terminal, and having a variable capacitance value; and
a switch group of switches coupled to terminals of the lower-side capacitor group at opposite sides to the lower-side common terminal and coupled to terminals of the upper-side capacitor group at opposite sides to the upper-side common terminal, the switch group being controlled as a conduction state and a non-conduction state in accordance with the digital input signal,
wherein the capacitance value of the coupling capacitor is adjusted so that a first potential and a second potential are equal to each other, the first potential being defined as a potential of the upper-side common terminal when upper-side bits of the digital input signal are set to a first upper-side bit value and lower-side bits of the digital input signal are set to a first lower-side bit value at which the values of all the bits of the lower-side bits are equal to 0 or 1, and the second potential being defined as a potential of the upper-side common terminal when the upper-side bits of the digital input signal are set to a second upper-side bit value which is different from the first upper-side bit value by only the minimum bit, and the lower-side bits of the digital input signal are set to a second lower-side bit value at which the values of all the bits of the lower-side bits are equal to 1 or 0.

5. The digital analog converter according to claim 4, wherein the first upper-side bit value is a center value of the possible range of the upper-side bits.

6. The digital analog converter according to claim 4, further comprising a dummy capacitor coupled to the lower-side common terminal and having a minimum-weighted capacitance value in the lower-side capacitor group.

7. The digital analog converter according to claim 4, further comprising an adjusting capacitor that is coupled to the lower-side common terminal and has a variable capacitance value.

8. A successive approximation analog digital converter comprising:
a digital analog converter including an input terminal receiving a digital input signal, a lower-side capacitor group of capacitors having capacitance values weighted by a binary rate and coupled to a lower-side common terminal in parallel, an upper-side capacitor group of capacitors having capacitance values weighted by a binary rate and coupled, in parallel, to an upper-side common terminal at which a first analog output signal is generated, a coupling capacitor provided between the lower-side common terminal and the upper-side common terminal, a switch group of switches coupled to terminals of the lower-side capacitor group at opposite sides to the lower-side common terminal respectively and coupled to terminals of the upper-side capacitor group at opposite sides to the upper-side common terminal respectively, the switch group being controlled as a conduction state and a non-conduction state in accordance with the digital input signal, and an adjusting capacitor coupled to the lower-side common terminal and having a variable capacitance value;
an analog input terminal receiving a second analog signal;
a comparator determining the magnitude relation between the first analog signal and the second analog signal; and
a logic circuit storing a determination result of the comparator as a value of a first bit and generating the digital signal for determination of a second bit lower than the first bit in accordance with the value of the first bit,
wherein the capacitance value of the adjusting capacitor is adjusted so that a first potential and a second potential are equal to each other, the first potential being defined as a potential of the upper-side common terminal when upper-side bits of the digital input signal are set to a first upper-side bit value and lower-side bits of the digital input signal are set to a first lower-side bit value at which the values of all the bits of the lower-side bits are equal to 0 or 1, and the second potential being defined as a potential of the upper-side common terminal when the upper-side bits of the digital input signal are set to a second upper-side bit value which is different from the first upper-side bit value by only the minimum bit, and the lower-side bits of the digital input signal are set to a second lower-side bit value at which the values of all the bits of the lower-side bits are equal to 1 or 0.

9. A successive approximation analog digital converter comprising:
a digital analog converter including an input terminal for receiving a digital input signal, a lower-side capacitor group of capacitors that have capacitance values weighted by a binary rate and are coupled to a lower-side common terminal in parallel, an upper-side capacitor group of capacitors that have capacitance values weighted by a binary rate and are coupled, in parallel, to an upper-side common terminal at which a first analog output signal is generated, a coupling capacitor provided between the lower-side common terminal and the upper-side common terminal and having a variable capacitance value, and a switch group of switches coupled to terminals of the lower-side capacitor group at opposite sides to the lower-side common terminal respectively and coupled to terminals of the upper-side capacitor group at opposite sides to the upper-side common terminal respectively, the switch group controlled as conduction and non-conduction in accordance with the digital input signal;
an analog input terminal receiving a second analog signal;
a comparator determining the magnitude relation between the first analog signal and the second analog signal; and
a logic circuit storing a determination result of the comparator as a value of a first bit and generating the digital signal for determination of a second bit lower than the first bit in accordance with the value of the first bit,
wherein the capacitance value of the adjusting capacitor is adjusted so that a first potential and a second potential are equal to each other, the first potential being defined as a potential of the upper-side common terminal when upper-side bits of the digital input signal are set to a first upper-side bit value and lower-side bits of the digital input signal are set to a first lower-side bit value at which the values of all the bits of the lower-side bits are equal to 0 or 1, and the second potential being defined as a potential of the upper-side common terminal when the upper-side bits of the digital input signal are set to a second upper-side bit value which is different from the first upper-side bit value by only the minimum bit, and the lower-side bits of the digital input signal are set to a second lower-side bit value at which the values of all the bits of the lower-side bits are equal to 1 or 0.

* * * * *